(12) United States Patent
John et al.

(10) Patent No.: US 7,611,955 B2
(45) Date of Patent: Nov. 3, 2009

(54) METHOD OF FORMING A BIPOLAR TRANSISTOR AND SEMICONDUCTOR COMPONENT THEREOF

(75) Inventors: Jay P. John, Chandler, AZ (US); James A. Kirchgessner, Tempe, AZ (US); Matthew W. Menner, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 272 days.

(21) Appl. No.: 11/454,403

(22) Filed: Jun. 15, 2006

(65) Prior Publication Data

US 2007/0293013 A1    Dec. 20, 2007

(51) Int. Cl.
*H01L 21/331* (2006.01)

(52) U.S. Cl. .................. 438/366; 438/320; 438/354; 257/E21.372

(58) Field of Classification Search ......... 438/234–236, 438/309, 312, 335, 364, 366, FOR. 165, FOR. 167, 438/318, 320, 353, 354, 367; 257/E21.35, 257/E21.372, E21.38, E21.382, E21.608, 257/E21.696
See application file for complete search history.

(56) References Cited

U.S. PATENT DOCUMENTS

| | | | |
|---|---|---|---|
| 5,130,268 A * | 7/1992 | Liou et al. ................. 438/425 |
| 5,296,391 A | 3/1994 | Sato et al. | |
| 5,432,779 A | 7/1995 | Sato et al. | |
| 5,759,883 A | 6/1998 | Kinoshita | |
| 5,773,350 A * | 6/1998 | Herbert et al. ............. 438/364 |
| 6,277,677 B1 * | 8/2001 | Lee ........................... 438/142 |
| 6,444,575 B1 * | 9/2002 | Yu et al. .................... 438/639 |
| 6,482,710 B2 * | 11/2002 | Oda et al. ................... 438/311 |
| 6,492,238 B1 | 12/2002 | Ahlgren et al. | |
| 6,509,242 B2 * | 1/2003 | Frei et al. .................. 438/312 |
| 6,531,369 B1 * | 3/2003 | Ozkan et al. .............. 438/312 |
| 6,635,545 B2 | 10/2003 | Bock et al. | |
| 2003/0096486 A1 * | 5/2003 | Chuang et al. ............. 438/309 |
| 2003/0098465 A1 * | 5/2003 | Suzumura et al. .......... 257/197 |

FOREIGN PATENT DOCUMENTS

| | | |
|---|---|---|
| WO | WO 02/47160 A2 | 6/2002 |
| WO | WO 03/049191 A2 | 6/2003 |

* cited by examiner

*Primary Examiner*—Matthew Smith
*Assistant Examiner*—Quovaunda Jefferson
(74) *Attorney, Agent, or Firm*—Bryan Cave LLP (57) ABSTRACT

A semiconductor component is formed using the following processes: (a) forming a first dielectric layer over the semiconductor substrate; (b) forming a base electrode for the bipolar transistor over the dielectric layer; (c) forming an oxide nitride structure over the base electrode; (d) forming a first spacer adjacent to the oxide nitride structure and the base electrode; (e) removing a top layer of the oxide nitride structure; (f) removing a first portion of the dielectric layer; (g) forming an epitaxial layer over the semiconductor substrate; (h) forming a second spacer over the epitaxial layer; and (i) forming an emitter electrode over the epitaxial layer and adjacent to the second spacer.

20 Claims, 8 Drawing Sheets

METHOD OF FORMING A BIPOLAR TRANSISTOR AND SEMICONDUCTOR COMPONENT THEREOF

FIELD OF THE INVENTION

This invention relates generally to semiconductor components, and relates more particularly to a method of forming a bipolar transistor.

BACKGROUND OF THE INVENTION

Recently, the Federal Communication Commission approved usage of the 77 gigahertz (GHz) radio band for the automobile radar market. To operate at this ultra high frequency band, a transistor must have a peak transit frequency, $f_T$, of approximately 200 GHz and a maximum oscillation frequency, $f_{MAX}$, of >200 GHz.

Currently, the majority of silicon-based products operating in the high frequency bands use SiGe BiCMOS (silicon germanium bipolar complimentary metal oxide semiconductor) technologies. For many of these products, a peak maximum oscillation frequency of 100 GHz is sufficient. In contrast, products operating in the 77 GHz band will most likely require use of a BiCMOS (bipolar complimentary metal oxide semiconductor) technology, including a much higher performance SiGe HBT (silicon germanium heterojunction bipolar transistor) device.

Accordingly, a need exists for a manufacturing process for a HBT (heterojunction bipolar transistor) that can be used at the 77 GHz radio band.

BRIEF DESCRIPTION OF THE DRAWINGS

The invention will be better understood from a reading of the following detailed description, taken in conjunction with the accompanying figures in the drawings in which.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly coupled in an electrical or non-electrical manner.

DETAILED DESCRIPTION OF THE INVENTION

In an embodiment, a semiconductor component is formed using the following process: (a) forming a first dielectric layer over the semiconductor substrate; (b) forming a base electrode for the bipolar transistor over the dielectric layer; (c) forming an oxide nitride structure over the base electrode; (d) forming a first spacer adjacent to the oxide nitride structure and the base electrode; (e) removing a top layer of the oxide nitride structure; (f) removing a first portion of the dielectric layer; (g) forming an epitaxial layer over the semiconductor substrate; (h) forming a second spacer over the epitaxial layer; and (i) forming an emitter electrode over the epitaxial layer and adjacent to the second spacer.

Figure 1:
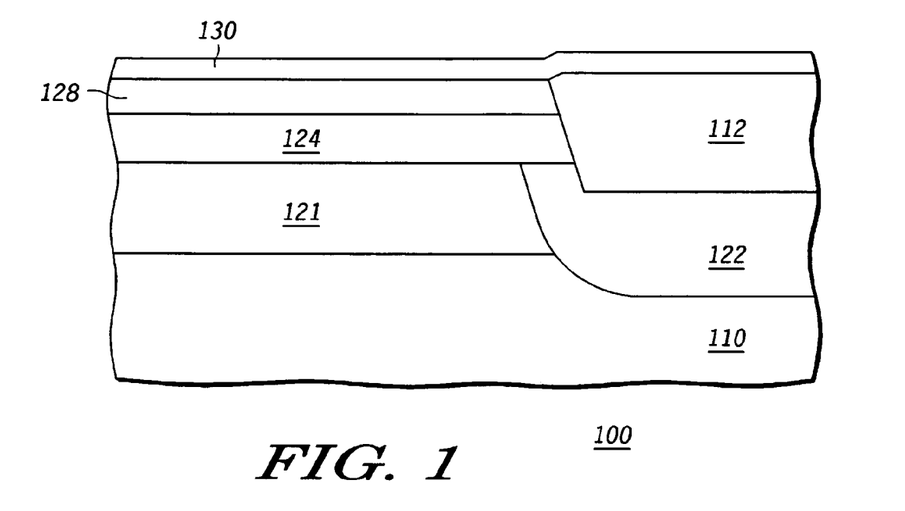
FIG. 1 illustrates a cross-sectional view of a portion of a first semiconductor component after a first stage of a manufacturing process according to a first embodiment.

Referring now to the figures, FIG. 1 illustrates a cross-sectional view of a portion of a first semiconductor component 100 after a first stage of a manufacturing process according to a first embodiment. It should be understood that semiconductor component 100 is merely exemplary and that the present invention may be manufactured using many different methods not specifically depicted or otherwise disclosed herein.

As an example, the portion of component 100 can include a semiconductor substrate 110. In one embodiment, substrate 110 can comprise a p-type bulk silicon wafer or a n-type bulk silicon wafer. In a different embodiment, substrate 110 can comprise a different semiconductor material such as silicon-germanium, germanium, gallium arsenide, or the like. In another embodiment, substrate 110 can be a semiconductor-on-insulator (SOI) wafer having, for example, a first silicon layer, a second silicon layer, and an electrical insulator layer located between the first and second silicon layers.

In one embodiment, substrate 110 is a p-type substrate and includes a heavily doped n-type region 122, a heavily doped n-type region 121, a less-heavily doped n-type region 124, and a moderately-doped n-type region 128. The methods of forming regions 121, 122, 124, and 128 are well-known in the art and will not be depicted herein.

An isolation structure 112 is formed over a portion of region 122 and can be formed before forming regions 121, 124, and layer 128. As examples, structure 112 can be formed using a STI (shallow trench isolation) method or a LOCOS (local oxidation of silicon) method.

After the formation of trench 112 and regions 121, 122, 124, and 128, a dielectric layer 130 is formed over layer 128 and structure 112. Layer 130 is an electrical insulating layer and can be formed by growing a thermal oxide, by depositing an oxide such as silicon oxy-nitride, an oxide formed using TEOS (tertraethylorthosilicate), or the like, or by growing and/or depositing a combination dielectric comprised of any of the previously listed materials.

Figure 2:
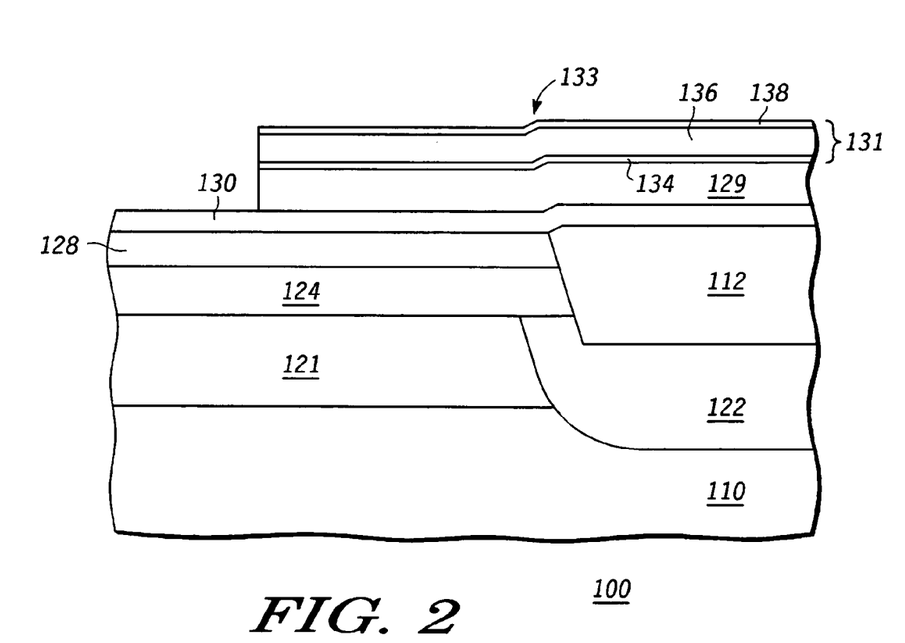
FIG. 2 illustrates a cross-sectional view of the portion of the first semiconductor component of FIG. 1 after a later stage of the manufacturing process according to the first embodiment.

Turning to the next drawing, FIG. 2 illustrates a cross-sectional view of the portion of a first semiconductor component 100 after a later stage of the manufacturing process. A base electrode layer 129 is formed over layer 130. As an example, layer 129 can be formed by depositing a layer of polysilicon over layer 130. Preferably, the thickness of layer 130 is approximately 1200 Å (Angstroms). In one embodiment, layer 129 can be deposited by a LPCVD (low-pressure chemical vapor deposition) method. Layer 129 can be heavily p-type doped in-situ, by ion implantation, or by thermal diffusion. In-situ, as used herein, includes either doping using the same chamber or the same tool.

An oxide nitride structure 131 is formed over the layer 129. Structure 131 includes oxide and nitride layers. In one embodiment, structure 131 includes a nitride layer 136 sandwiched between two oxide layers 134 and 138 i.e. an ONO structure. As an example, a silicon nitride ($Si_3N_4$) layer 136 can be formed between two layers of an oxide formed using TEOS 134 and 138. Layers 134 can be formed by depositing an approximately 150 Å thick layer of oxide formed using TEOS over layer 129. Layer 136 can be formed by low-pressure chemical vapor deposition of an approximately 600 Å thick layer of silicon nitride over layer 134. Layers 138 can be formed by depositing an approximately 150 Å thick layer of oxide formed using TEOS over layer 136.

In other embodiments, structure 131 can comprise an oxide layer formed over a nitride layer, a nitride layer formed over an oxide layer, other two dielectric layer stacks, an oxide layer sandwiched between two nitride layers, or other three or more dielectric layer stacks.

After depositing structure 131, layer 129, and structure 131 are patterned and etched to form an emitter region 133. In one embodiment, a masking layer is formed over layer 138. The masking layer can be a photoresist mask or a hard-etch mask. An etching process then is used to sequentially etch layers 138, 136, 134, and 129.

As an example, a first reactive ion etch process can be used to etch through a portion of layer 138 to form a first portion of region 133. Then, a second RIE etch process can be used to etch through a portion of layer 136 to form a second portion of region 133. A third RIE etch process, which can be similar to the first RIE etch process, can be used to etch through a portion of layer 134 to form a third portion of region 133. Finally, a fourth RIE etch process can be used to etch through a portion of layer 129 to form a fourth portion of region 133.

Figure 3:
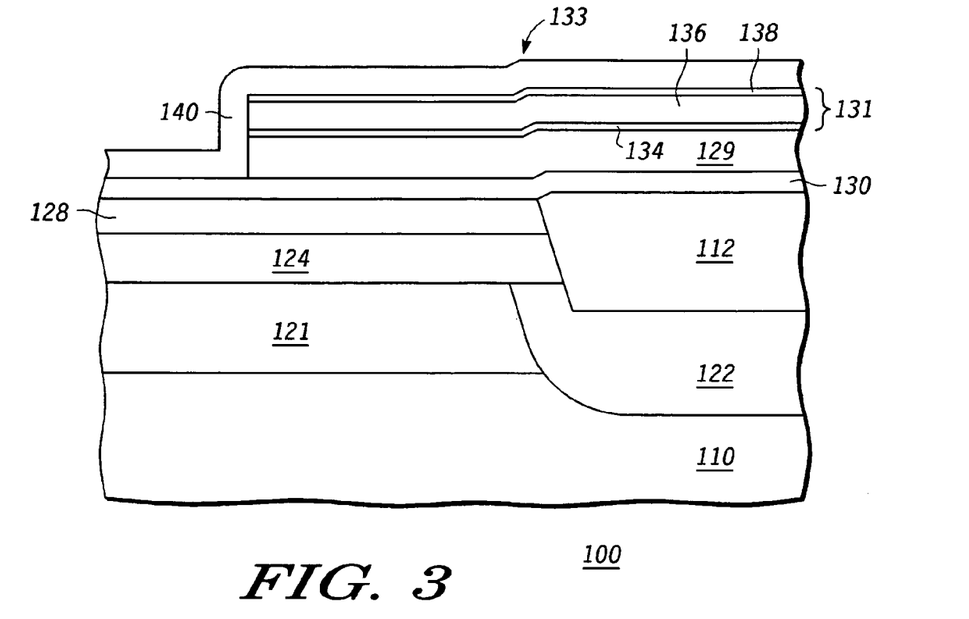
FIG. 3 illustrates a cross-sectional view of the portion of the first semiconductor component of FIG. 2 after a subsequent stage of the manufacturing process according to the first embodiment.

FIG. 3 illustrates a cross-sectional view of a portion of the first semiconductor component 100 after a subsequent stage of the manufacturing process. After forming region 133, an insulating layer 140 is formed over layers 129 and 130 and structure 131. As an example, layer 140 can be formed by a LPCVD deposition of silicon nitride. Preferably, the thickness of layer 140 is approximately 600 Å. In the same or different embodiment, layer 140 is composed of the same material as layer 136.

Figure 4:
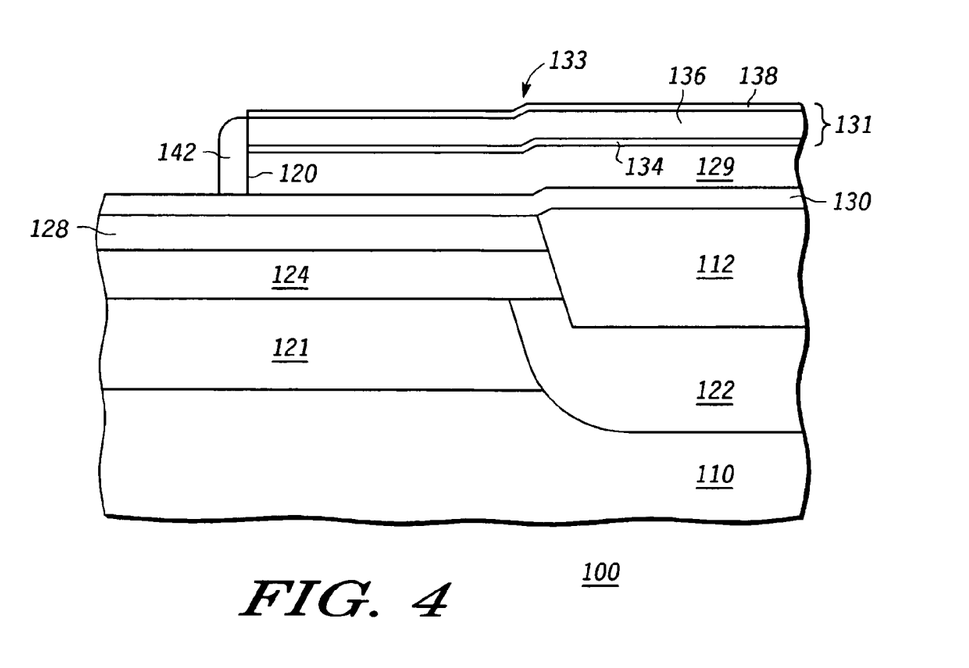
FIG. 4 illustrates a cross-sectional view of the portion of the first semiconductor component of FIG. 3 after a further stage of the manufacturing process according to the first embodiment.

FIG. 4 illustrates a cross-sectional view of semiconductor component 100 after a further stage of the manufacturing process. A spacer 142 is formed adjacent to structure 131 and layers 129 and 130 by removing a portion of layer 140 (FIG. 3). Spacer 142 seals a sidewall 120 of layer 129 to prevent selective epitaxial growth on sidewall 120 in a later manufacturing step. The width of spacer 142 is usually less than 2000 Å with a preferred width of approximately 600 Å. As an example, layer 140 (FIG. 4) can be anisotropically etched. In one embodiment, layer 140 can be etched using a dry etch process, stopping on layers 130 and 138. Use of a mask is usually not required because of the anisotropic nature of the etch. As an example, a RIE process is used to etch layer 140 and form spacer 142.

Figure 5:
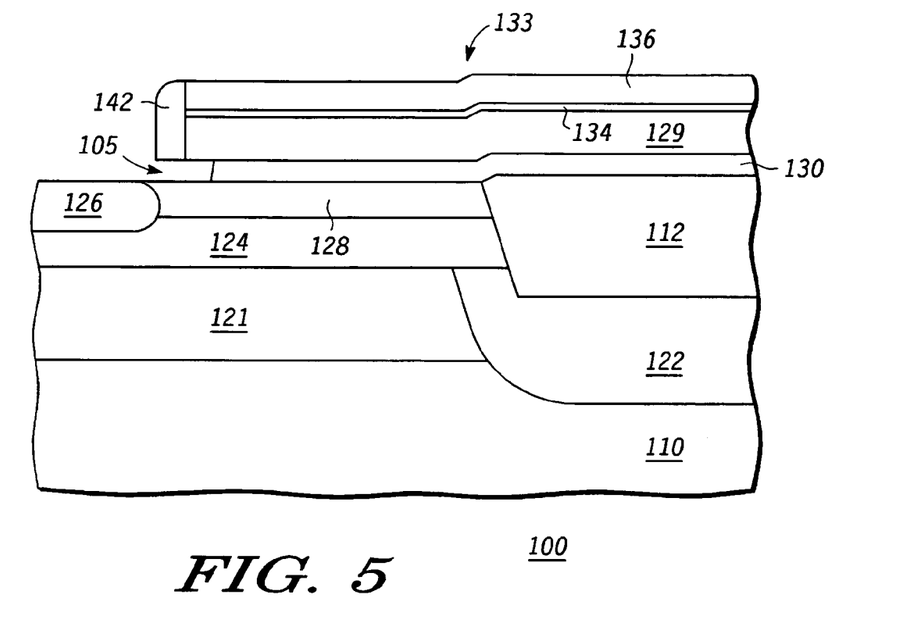
FIG. 5 illustrates a cross-sectional view of the portion of the first semiconductor component of FIG. 4 after a subsequent stage of the manufacturing process according to the first embodiment.

FIG. 5 illustrates a cross-sectional view of a portion of the first semiconductor component 100 after a subsequent stage of the manufacturing process. Layer 138 (FIG. 4) and a portion of layer 130 have been removed. The portion of layer 130 removed forms a cavity 105 and exposes a portion of region 128 and a portion of the underside of layer 129. As an example, layers 130 and 138 can be wet etched by a hydrofluoric acid (HF) solution. The selective etching ends at region 128 and layer 136., In one embodiment, the removal of layer 138 and the portion of layer 130 can occur simultaneously with each other.

Following the formation of cavity 105, regions 124 and 128 can be optionally n-type doped to form a region 126. As an example, a selectively implanted collector (SIC) implant can be performed in a portion of regions 124 and 128 to form region 126. As a further example, region 126 can be self-aligned by spacer 142 and layers 136, 134, 130, and 129. Doping regions 124 and 128 improves $f_T$ of component 100. However, excess dopants too close to the transistor base will undesirably increase the collector-base capacitance of the transistor and hence degrade both $f_T$ and $f_{MAX}$.

Furthermore, in the same or a different embodiment, before implanting, an additional oxide layer can be deposited in cavity 105 and over layer 136 and region 128 in order to further reduce the collector-base capacitance. An additional etch is also used, in this embodiment, to remove the oxide layer after the implanting. As an example, the additional oxide layer can be formed by depositing and/or growing an approximately 750 Å thick layer of silicon dioxide over region 128 and layer 136, and in cavity 105. The oxide layer can be removed by performing a wet HF etch after doping regions 124 and 128. In another embodiment, instead of implanting after the formation of cavity 105, the implanting can be performed after the formation of spacer 142 and before the formation of cavity 105.

Figure 6:
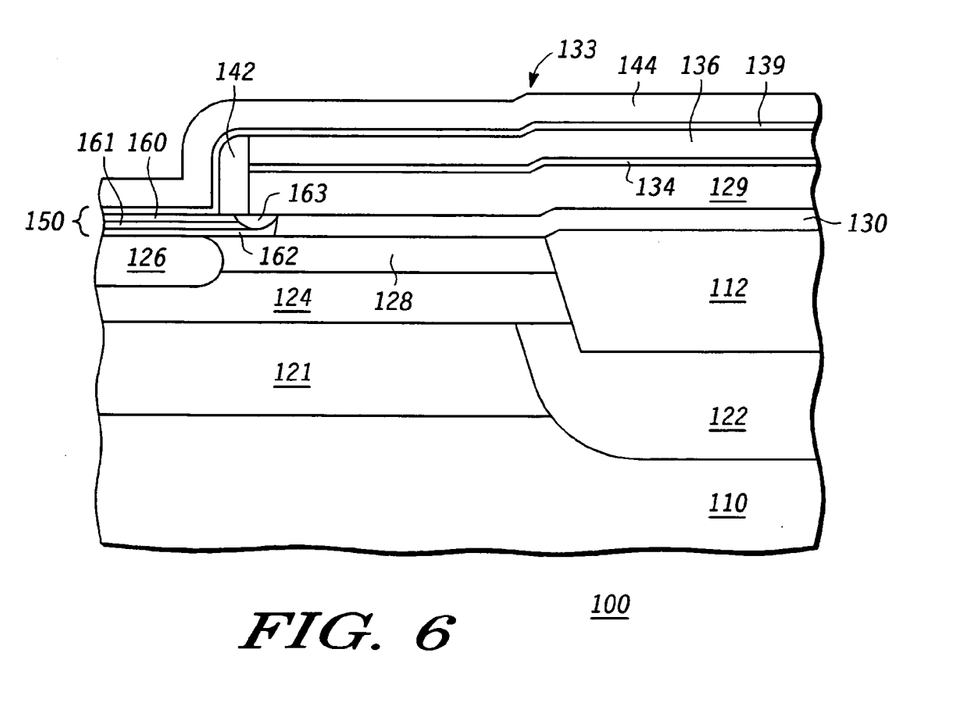
FIG. 6 illustrates a cross-sectional view of the portion of the first semiconductor component of FIG. 5 after an even later stage of the manufacturing process according to the first embodiment.

FIG. 6 illustrates a cross-sectional view of a portion of the first semiconductor component 100 after an even later stage of the manufacturing process. An epitaxial layer 150 is formed over regions 126 and 28 with a portion of layer 150 under spacer 142 and layer 129. Layer 150 couples together layers 126 and 129. In one embodiment, layer 150 is doped. As an example, a portion of layer 150 includes a boron dopant.

In one embodiment, layer 150 can be a composite epitaxial layer. As an example, layer 150 can formed by the process of: (a) growing a silicon epitaxial layer 162 over regions 126 and 128; (b) growing a SiGeC (silicon-germanium-carbon) epitaxial layer 161 over layer 162; and (c) growing a silicon epitaxial layer 160 over layer 161. In this embodiment, only layer 161 can be doped or all three layers 160, 161, and 162 can be doped. In other embodiments, layer 150 can be a composite epitaxial layer formed by a combination of silicon, silicon germanium (SiGe), SiGeC, or other crystalline semiconductor materials.

Furthermore, a region 163 is formed during the formation of layer 150. In one embodiment, region 163 is a non-crystalline epitaxial region formed during the formation of layer 150 and doped by diffusion from layer 129. In another embodiment, region 163 is a portion of region 150, which is doped by diffusion from layer 129.

A dielectric layer 139 is formed over spacer 142 and layers 136 and 150. As an example, layer 139 can be formed by depositing an oxide formed using TEOS. Preferably, the thickness of layer 139 is approximately 300 Å.

A spacer layer 144 is deposited over layer 139. In one embodiment, amorphous silicon (a-Si) is deposited to form layer 144. In another embodiment, the a-Si layer is implanted with one or more N+ dopants. In a further embodiment, the a-Si layer is doped in-situ. In yet another embodiment, layer 139 is formed by deposition of silicon nitride instead of a-Si.

Figure 7:
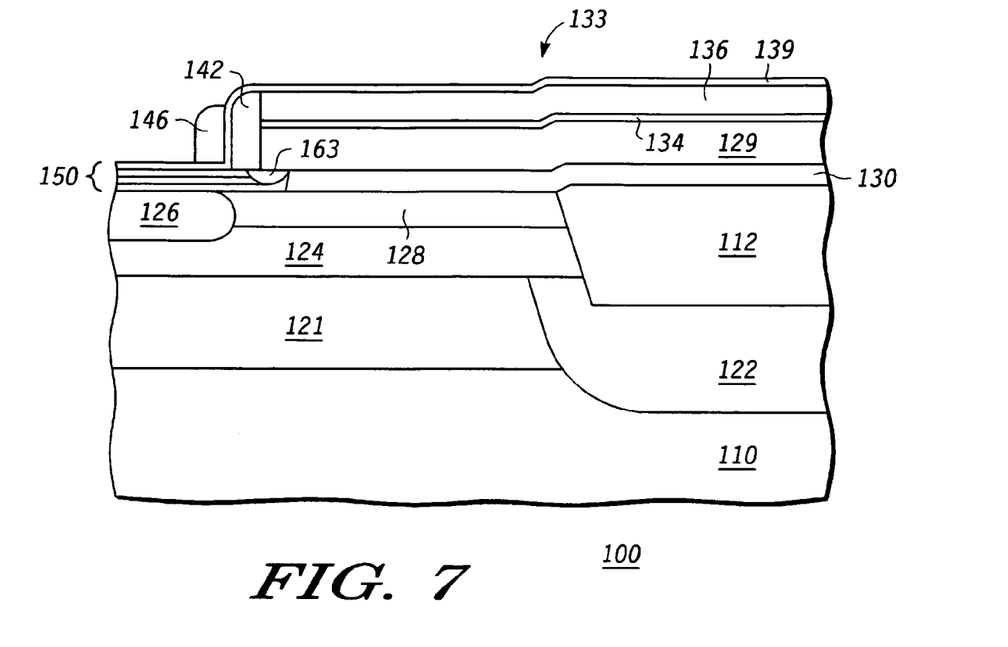
FIG. 7 illustrates a cross-sectional view of the portion of the first semiconductor component of FIG. 6 after a subsequent stage of the manufacturing process according to the first embodiment.

FIG. 7 illustrates a cross-sectional view of a portion of the first semiconductor component 100 after a subsequent stage of the manufacturing process. A portion of layer 144 (FIG. 6) is removed to form a spacer 146. In one embodiment, layer 144 is anisotropically etched, using layer 139 as an etch stop, to form spacer 146. As an example, layer 144 can be etched using a RIE process to form spacer 146.

Figure 8:
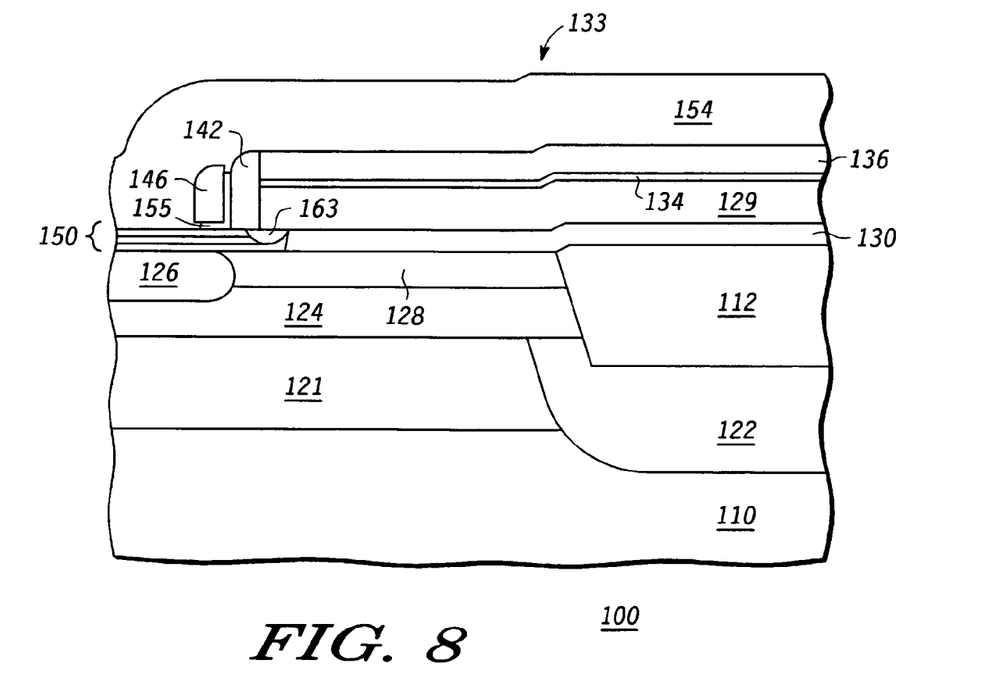
FIG. 8 illustrates a cross-sectional view of the portion of the first semiconductor component of FIG. 7 after a later stage of the manufacturing process according to the first embodiment.

FIG. 8 illustrates a cross-sectional view of a portion of the first semiconductor component 100 after a later stage of the manufacturing process. Spacer 155 is formed by removing a portion of layer 139 (FIG. 7). In one embodiment, layer 139 is wet-etched to form spacer 155 using spacer 146 as a hard mask and spacer 142 and layers 136 and 150 as etch stop layers. In another embodiment, layer 139 can be etched, spacer 155 is formed by anisotropically etching part of layer 139 before the wet etching the rest of layer 139.

An emitter electrode 154 is formed over layers 136 and 150, and adjacent to spacers 142, 146, and 155. In one embodiment, emitter 154 is formed by depositing an in-situ doped polysilicon layer and then etching or patterning the layer. A hydrogen pre-bake is performed for mono-emitters to eliminate any interfacial oxide layer between emitter 154 and layer 150, which will also promote epitaxial alignment of layer 154. In another embodiment, a polysilicon emitter electrode 154 can be deposited and then doped with ion implantation.

After forming one or more subsequent metallization and passivation layers (not shown in FIG. 8), semiconductor component 100 can be diced or cut into die or chips to singulate semiconductor component 100 from other semiconductor components.

Figure 9:
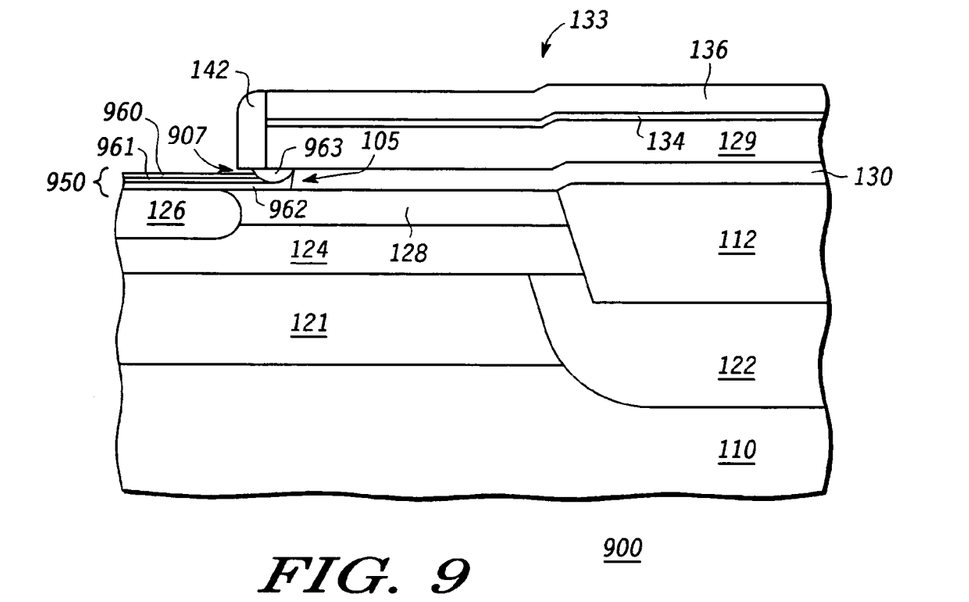
FIG. 9 illustrates a cross-sectional view of a second semiconductor component according to a second embodiment.

FIG. 9 illustrates a cross-sectional view of the second embodiment of a portion of a second semiconductor component 900 after a stage of the manufacturing process. The manufacturing process of the second embodiment is similar to the first embodiment through the stage of the manufacturing process shown in FIG. 5. In this second embodiment, an epitaxial layer 950 is formed over layer 128 and region 126, with a portion of layer 950 under spacer 142 and layer 129. In this embodiment, layer 950 is formed with a thickness less than the thickness of layer 130. When the thickness of layer 950 is less than layer 130, a cavity 907 is formed under spacer 142.

In one embodiment, layer 950 can be a composite epitaxial layer with one or more of the epitaxial layers formed by a timed deposition. As an example, when substrate 110 is a silicon substrate, layer 950 can formed by the process of: (a) performing a timed growth of a silicon epitaxial layer 962 over regions 126 and 128; (b) performing a timed growth of a SiGeC (silicon-germanium-carbon) epitaxial layer 961 over layer 962; and (c) performing a timed growth of a silicon epitaxial layer 960 over layer 961. In this embodiment, only layer 961 can be doped or all three layers 960, 961, and 962 can be doped. In other embodiments, layer 950 can be a composite epitaxial layer formed by a combination of silicon, silicon germanium (SiGe), SIGeC or other crystalline semiconductor layers.

Furthermore, a region 963 is formed during the formation of layer 950. In one embodiment, region 963 is a non-crystalline epitaxial region formed during the formation of layer 950 and doped by diffusion from layer 129. In another embodiment, region 963 is a portion of region 950, which is doped by diffusion from layer 129.

Figure 10:
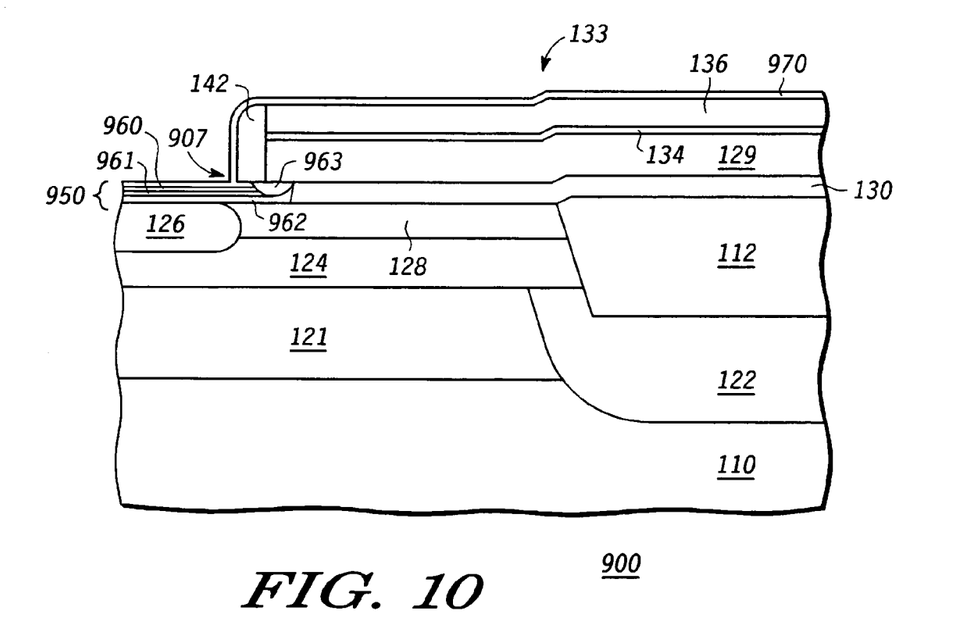
FIG. 10 illustrates a cross-sectional view of the second semiconductor component of FIG. 9 after a later stage of the manufacturing process according to the second embodiment.

FIG. 10 illustrates a cross-sectional view of a portion of a second semiconductor component 900 after a later stage of the manufacturing process of the second embodiment. A dielectric layer 970 is formed over layers 136 and 950, and spacer 142. Layer 970 also fills cavity 907. As an example, layer 970 can be formed by deposition and/or growth of an oxide layer formed using TEOS or other oxide layer.

Figure 11:
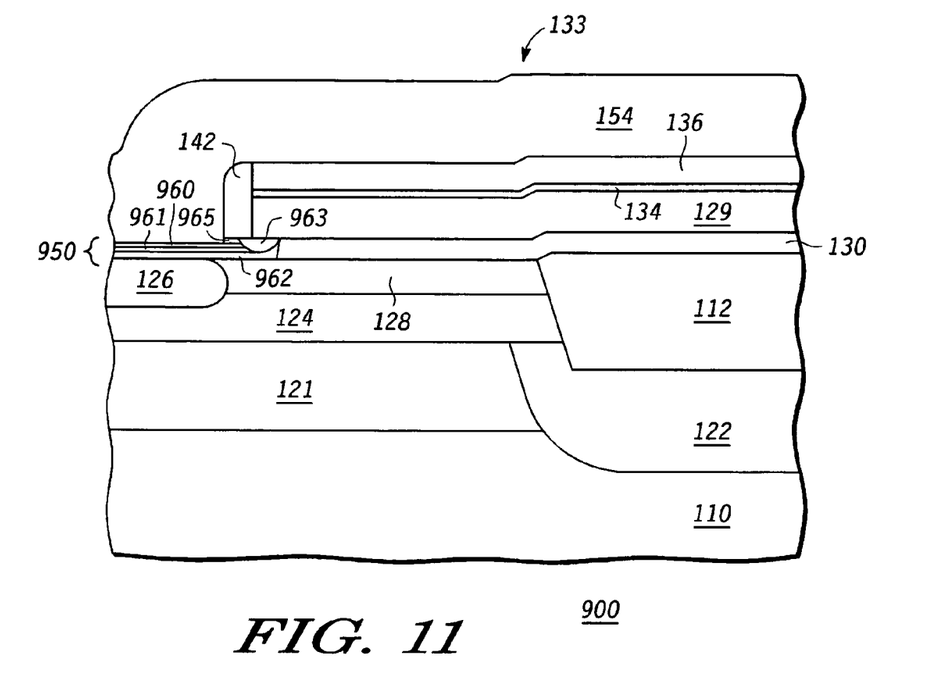
FIG. 11 illustrates a cross-sectional view of the second semiconductor component of FIG. 10 after a subsequent stage of the manufacturing process according to the second embodiment.

FIG. 11 illustrates a cross-sectional view of a portion of a second semiconductor component 900 after a subsequent stage of the manufacturing process of the second embodiment. A spacer 965 is formed by removing a portion of layer 970 (FIG. 10). Spacer 965 is located underneath spacer 142 and over layer 950. In one embodiment, spacer 965 is formed by etching layer 970 during a hydrogen fluoride dip. In another embodiment, spacer 965 is formed by anisotropically etching layer 970 before the hydrogen fluoride dip. As an example, spacer 965 can be formed by a timed RIE etch of an oxide layer formed using TEOS. Subsequently, emitter electrode 154 is formed over layers 136 and 950, and adjacent to spacers 142 and 962.

Figure 12:
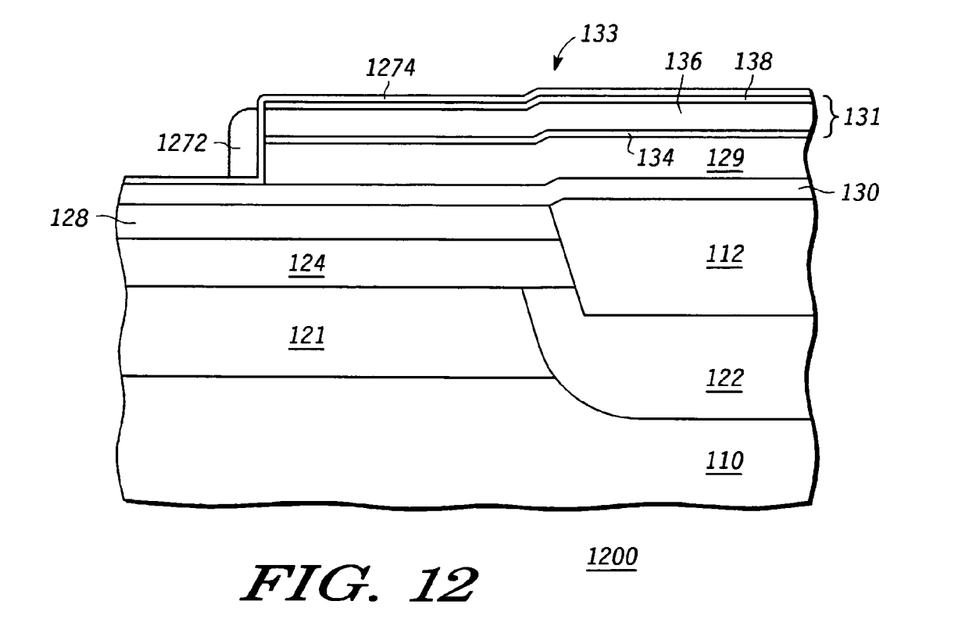
FIG. 12 illustrates a cross-sectional view of a third semiconductor component according to a third embodiment.

FIG. 12 illustrates a cross-sectional view of a portion of a third embodiment of a semiconductor component 1200. The manufacturing process of the third embodiment is similar to the first embodiment through the stage of the manufacturing process shown in FIG. 2. In the third embodiment, a etch stop layer 1274 is formed over structure 131 and layer 130. As an example, layer 1274 can be formed by depositing a silicon nitride layer. Preferably, layer 1274 has a thickness of 200 Å.

Next, a spacer 1272 is formed over layer 1274 and adjacent to structure 131. In one embodiment, spacer 1272 can be formed by depositing and a 750 Å thick oxide layer formed using TEOS and then removing a portion of the oxide layer formed using TEOS using an anisotropic etch process. For example, a RIE etch of the oxide layer formed using TEOS can be performed using layer 1274 as an etch stop.

Figure 13:
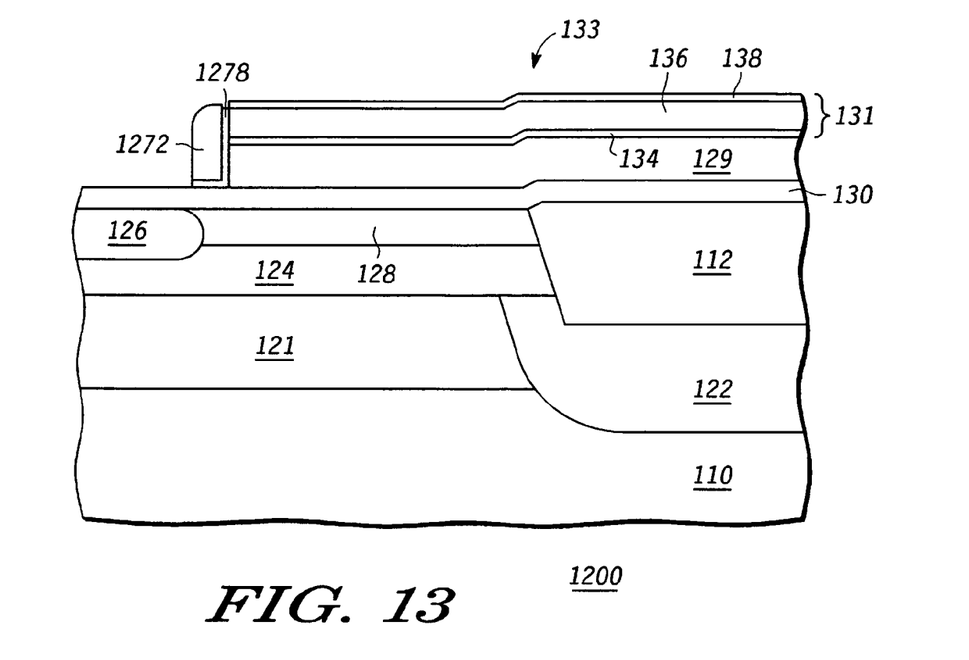
FIG. 13 illustrates a cross-sectional view of the third semiconductor component of FIG. 12 after a subsequent stage of the manufacturing process according to the third embodiment.

FIG. 13 illustrates a cross-sectional view of a portion of the third semiconductor component 1200 after a subsequent stage of the manufacturing process of the third embodiment. A spacer 1278 is formed by removing a portion of layer 1274 (FIG. 13). In one embodiment, spacer 1278 is formed by anisotropically etching layer 1274. Spacer 1272 can act as a hard mask for the etching of layer 1274. As an example, if layer 1274 is silicon nitride layer and spacer 1272 is an oxide spacer formed using TEOS spacer, a RIE etching process can be performed on layer 1274 with spacer 1272 acting as a hard mask and layers 130 and 138 as etch stop layers.

Figure 14:
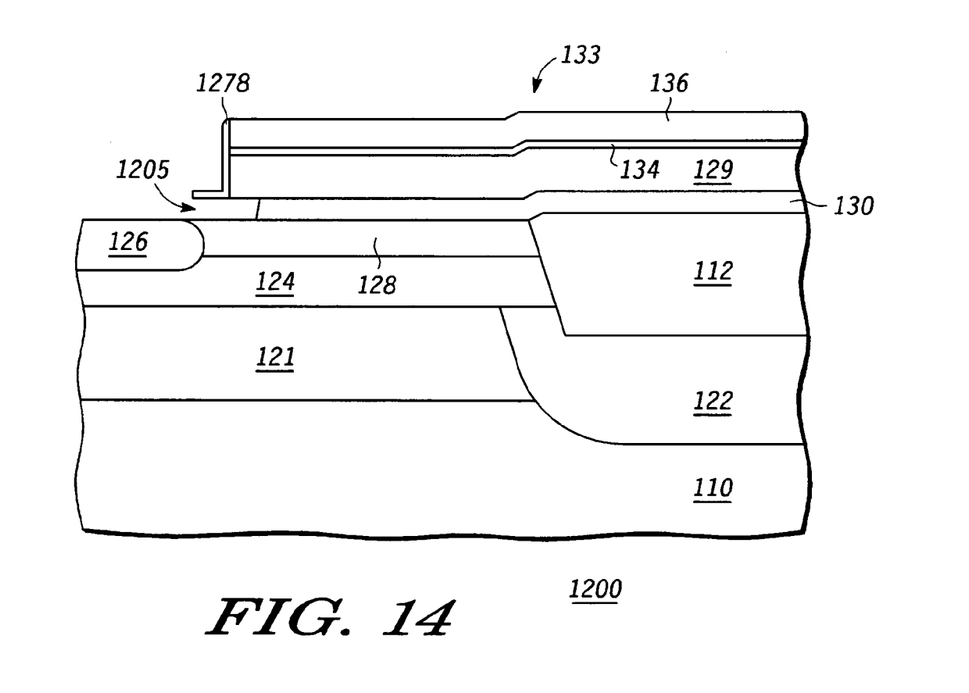
FIG. 14 illustrates a cross-sectional view of the third semiconductor component of FIG. 13 after a later stage of the manufacturing process according to the third embodiment.

FIG. 14 illustrates a cross-sectional view of a portion of a third semiconductor component 1200 after a later stage of the manufacturing process of the third embodiment. Spacer 1272, layer 138, and a portion of layer 130 (FIG. 13) have been removed. Cavity 1205 is created beneath spacer 1278 and layer 129 by the removal of the portion of layer 130. In one embodiment, the removal of spacer 1272, layer 138, and a portion of layer 130 can occur simultaneously with each other. As an example, a single wet oxide etch can be performed to remove spacer 1272, layer 138, and a portion of layer 130 simultaneously, if spacer 1272, and layers 130 and 138 are formed of the same or similar materials.

Figure 15:
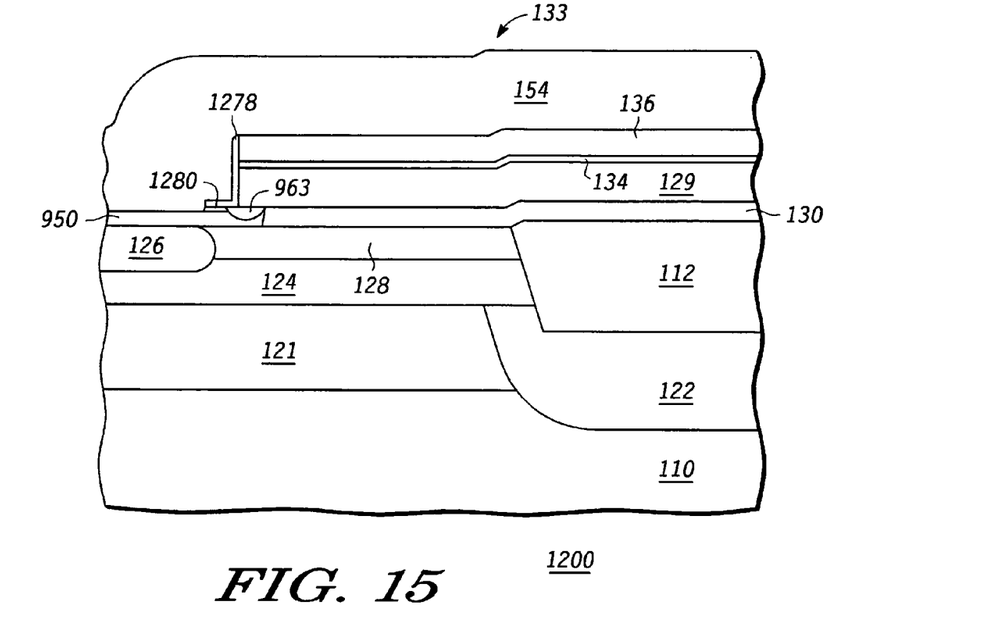
FIG. 15 illustrates a cross-sectional view of the third semiconductor component of FIG. 14 after a subsequent stage of the manufacturing process according to the third embodiment.

FIG. 15 illustrates a cross-sectional view of a portion of a third semiconductor component 1200 after a subsequent stage of the manufacturing process of the third embodiment. Layer 950 and region 963 are formed underneath a portion of layer 129 and spacer 1278. Next, a spacer 1280 is formed above layer 950 and beneath spacer 1278. In one embodiment, spacer 1280 can be formed by depositing a oxide layer formed using TEOS and then removing a portion of the oxide layer formed using TEOS using an anisotropic etch process. For example, a RIE etch of the oxide layer formed using TEOS can be performed. In another example, spacer 1280 can be formed by anisotropically etching part of the oxide layer formed using TEOS before wet etching the rest of the oxide layer formed using TEOS.

Subsequently, emitter electrode 154 is formed over layers 136 and 950, and adjacent to spacers 1278 and 1280.

Figure 16:
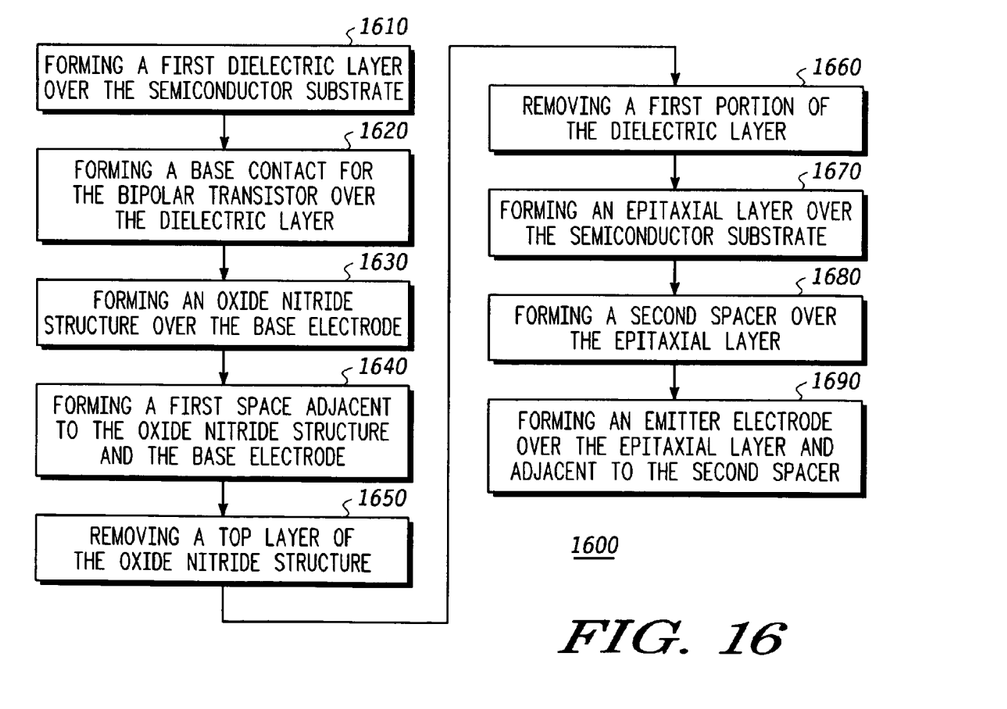
FIG. 16 illustrates a flow chart for a method of manufacturing a semiconductor component according to an embodiment.

FIG. 16 illustrates a flow chart 1600 for a method of manufacturing a semiconductor component. The method forms an emitter-base structure for a bipolar transistor. Flow chart 1600 includes a process 1610 of forming a first dielectric layer over the semiconductor substrate. As an example, the first dielectric layer of process 1610 can be similar to layer 130 in FIG. 1. Flow chart 1600 in FIG. 16 continues with a process 1620 of forming a base electrode for the bipolar transistor over the dielectric layer. As an example, the base electrode of process 1620 can be similar to layer 129 of FIG. 2.

Flow chart 1600 in FIG. 16 continues with a step 1630 of forming an oxide nitride structure over the base electrode. As an example, the oxide nitride structure of step 1630 can be similar to structure 131 of FIG. 2. Flow chart 1600 in FIG. 16 continues with a step 1640 of forming a first spacer adjacent to the oxide nitride structure and the base electrode. As an example, the first spacer of step 1640 can be similar to spacer 142 of FIG. 4.

Subsequently, flow chart 1600 in FIG. 16 continues with a step 1650 of removing a top layer of the oxide nitride structure. As an example, the resulting oxide nitride structure after the removal of the top layer of the oxide nitride structure of step 1650 can be similar to component 100 in FIG. 5 and component 1200 in FIG. 14.

Flow chart 1600 in FIG. 16 continues with a step 1660 of removing a first portion of the dielectric layer. As an example, the resulting structure after the removal of a first portion of the dielectric layer of step 1660 can be similar to component 100 of FIG. 5.

Next, flow chart 1600 in FIG. 16 continues with a step 1670 of forming an epitaxial layer over the semiconductor substrate. As an example, the epitaxial layer of step 1670 can be similar to layer 150 of FIG. 6 and layer 950 of FIG. 9. Flow chart 1600 in FIG. 16 continues with a step 1680 of forming a second spacer over the epitaxial layer. As an example, the second spacer of step 1680 can be similar to spacer 146 or 155 of FIGS. 7 and 8, spacer 965 of FIG. 11, and/or spacer 1280 of FIG. 15. Subsequently, flow chart 1600 in FIG. 16 continues with a step 1690 of forming an emitter electrode over the epitaxial layer and adjacent to the second spacer. In a different embodiment of step 1690, the emitter electrode can be formed adjacent to the first and second spacers. As an example, the emitter electrode in step 1690 can be similar to electrode 154 of FIG. 8.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that layers 129, 130, 134, 136, 138, 139, or 144 may be comprises of many different material and formed by many different methods, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of forming a bipolar transistor comprising:
   forming a first dielectric layer over a semiconductor substrate;
   forming a base electrode for the bipolar transistor over the first dielectric layer;
   forming an oxide nitride structure over the base electrode;

forming a first spacer adjacent to the oxide nitride structure and the base electrode;
removing a top layer of the oxide nitride structure;
removing a first portion of the first dielectric layer;
forming an epitaxial layer over the semiconductor substrate;
forming a second spacer over the epitaxial layer;
forming an emitter electrode adjacent over the epitaxial layer and adjacent to the second spacer;
forming a third spacer adjacent to the oxide nitride structure before forming the first spacer; and
removing the third spacer,
wherein:
removing the third spacer, removing the top layer of the oxide nitride structure, and removing a first portion of the first dielectric layer occur simultaneously with each other and occur after forming the first spacer.

2. The method of claim 1, wherein:
forming the epitaxial layer comprises:
forming the epitaxial layer with a portion of the epitaxial layer formed underneath the base electrode and the first spacer.

3. The method of claim 1, wherein:
removing the first portion of the first dielectric layer comprises:
exposing a portion of the semiconductor substrate; and
forming the epitaxial layer comprises:
forming the epitaxial layer over the portion of the semiconductor substrate.

4. The method of claim 1, wherein:
forming the epitaxial layer comprises:
forming the epitaxial layer with a thickness less than a thickness of the first dielectric layer.

5. The method of claim 1, wherein:
forming the second spacer comprises:
forming a second spacer adjacent to the first spacer, such that the first spacer is located between the second spacer and the oxide nitride structure.

6. The method of claim 1, wherein:
forming the second spacer comprises:
forming the second spacer over a portion of the epitaxial layer and under the first spacer.

7. The method of claim 6, wherein:
forming the second spacer comprises:
forming an oxide layer over the epitaxial layer, the first spacer and the oxide nitride structure; and
anisotropically etching the oxide layer to form the second spacer.

8. The method of claim 1, wherein:
forming the first spacer comprises:
forming a nitride layer over the first dielectric layer and the oxide nitride structure; and
anisotropically etching the nitride layer to form the first spacer.

9. The method of claim 1, further comprising:
providing a substrate comprising silicon for the semiconductor substrate, and
wherein:
forming the epitaxial layer comprises:
forming a first silicon epitaxial layer over a portion of the silicon substrate;
forming a SiGeC epitaxial layer over the first silicon layer; and
forming a second silicon epitaxial layer over the SiGeC epitaxial layer.

10. A semiconductor component formed from the method of claim 1.

11. The method of claim 1, wherein:
forming the oxide nitride structure over the base electrode comprises:
forming a first oxide layer over the base electrode;
forming a first nitride layer over the first oxide layer; and
forming a second oxide layer over the first nitride layer.

12. A method of forming a bipolar transistor comprising:
forming a first dielectric layer over a semiconductor substrate;
forming a base electrode for the bipolar transistor over the first dielectric layer;
forming an oxide nitride structure over the base electrode;
forming a second dielectric layer over the oxide nitride structure and the first dielectric layer;
anisotropically etching a portion of the second dielectric layer to form a first spacer adjacent to the base electrode and the oxide nitride structure;
removing a top layer of the oxide nitride structure after anisotropically etching the portion of the second dielectric layer;
removing a first portion of the first dielectric layer to expose a portion of the semiconductor substrate;
growing an epitaxial layer over the portion of the silicon substrate;
forming a second spacer over the epitaxial layer;
forming an emitter electrode aver the apitaxial to the first spacer and the second spacer;
forming a third spacer adjacent to the oxide nitride structure before forming the second dielectric layer; and
removing the third spacer,
wherein:
removing the third spacer, removing the top layer of the oxide nitride structure, and removing the first portion of the first dielectric layer occur simultaneously with each other.

13. The method of claim 12, further comprising:
using the third spacer as an etch mask while anisotropically etching the portion of the second dielectric layer.

14. The method of claim 12, wherein:
forming the second spacer comprises:
forming the second spacer over a portion of the epitaxial layer and under the first spacer.

15. The method of claim 12, wherein:
forming the epitaxial layer comprises:
forming the epitaxial layer with a thickness less than a thickness of the first dielectric layer.

16. A semiconductor component formed from the method of claim 12.

17. The method of claim 12, further comprising:
forming a second oxide layer over the base electrode before forming the first oxide laser and the first nitride layer,
wherein:
forming a first nitride layer over the base electrode comprises:
forming a first nitride layer over the second oxide layer.

18. A method of forming a bipolar transistor comprising:
forming a first dielectric layer over a semiconductor substrate;
forming a base electrode for the bipolar transistor over the first dielectric layer;
forming a first oxide layer over the base electrode;
forming a first nitride layer over the first oxide layer;
forming a second oxide layer over the first nitride layer, wherein the first oxide lever, the first nitride layer, and the second oxide layer form an oxide nitride structure;

forming a first spacer adjacent to the oxide nitride structure and the base electrode;

removing the second oxide layer;

removing a first portion of the first dielectric layer;

forming an epitaxial layer over the semiconductor substrate;

forming second spacer over a portion of the epitaxial layer and adjacent to the second spacer; and removing the third spacer, wherein:

removing the third spacer, removing the second oxide layer, and removing a first portion of the first dielectric layer occur simultaneously with each other and occur after forming the first spacer.

19. The method of claim 18 wherein:

forming the first spacer comprises:

forming a nitride layer over the first dielectric layer and the oxide nitride structure; and anisotropically etching the nitride layer to form the first spacer.

20. The method of claim 18, wherein:

removing the first portion of the first dielectric layer comprises:

exposing a portion of the semiconductor substrate; and forming the epitaxial layer comprises:

forming the epitaxial layer over the portion of the semiconductor substrate.

\* \* \* \* \*

UNITED STATES PATENT AND TRADEMARK OFFICE
CERTIFICATE OF CORRECTION

PATENT NO. : 7,611,955 B2
APPLICATION NO. : 11/454403
DATED : November 3, 2009
INVENTOR(S) : Jay P. John, James A. Kirchgessner and Matthew W. Menner It is certified that error appears in the above-identified patent and that said Letters Patent is hereby corrected as shown below:

In the Claims

Column 9, line 36, Claim 5, please change "forming a second spacer" to be --forming the second spacer--

Column 10, lines 27-28, Claim 12, please change "electrode aver the apitaxial to the first spacer and the second spacer," to be --electrode over the epitaxial layer and adjacent to the first spacer and the second spacer;--

Column 11, lines 7-8, Claim 18, please change "forming second spacer over a portion of the epitaxial layer and adjacent to the second spacer; and" to be --forming a second spacer over a portion of the epitaxial layer and under the first spacer; forming an emitter electrode over the epitaxial layer and adjacent to the second spacer; forming a third spacer adjacent to the oxide nitride structure before forming the first spacer; and--

Signed and Sealed this
Thirteenth Day of August, 2013

Teresa Stanek Rea
*Acting Director of the United States Patent and Trademark Office*